(12) United States Patent
Saito et al.

(10) Patent No.: US 8,946,668 B2
(45) Date of Patent: Feb. 3, 2015

(54) SEMICONDUCTOR DEVICE AND METHOD OF MANUFACTURING THE SAME

(75) Inventors: Yukishige Saito, Minato-ku (JP); Kimihiko Ito, Minato-ku (JP); Hiromitsu Hada, Minato-ku (JP)

(73) Assignee: NEC Corporation, Tokyo (JP)

(*) Notice: Subject to any disclaimer, the term of this patent is extended or adjusted under 35 U.S.C. 154(b) by 88 days.

(21) Appl. No.: 13/574,405

(22) PCT Filed: Jan. 21, 2011

(86) PCT No.: PCT/JP2011/051054
§ 371 (c)(1),
(2), (4) Date: Jul. 20, 2012

(87) PCT Pub. No.: WO2011/090152
PCT Pub. Date: Jul. 28, 2011

(65) Prior Publication Data
US 2012/0286231 A1 Nov. 15, 2012

(30) Foreign Application Priority Data
Jan. 21, 2010 (JP) .................................. 2010-010715

(51) Int. Cl.
H01L 29/02 (2006.01)
H01L 47/00 (2006.01)
H01L 23/522 (2006.01)
H01L 45/00 (2006.01)

(52) U.S. Cl.
CPC .......... *H01L 23/5228* (2013.01); *H01L 45/145* (2013.01); *H01L 45/04* (2013.01); *H01L 45/1233* (2013.01); *H01L 45/1675* (2013.01)
USPC ............. 257/2; 257/4; 257/E47.001; 438/382

(58) Field of Classification Search
USPC ........................................................ 257/85
See application file for complete search history.

(56) References Cited

U.S. PATENT DOCUMENTS

| 2008/0036508 A1* | 2/2008 | Sakamoto et al. ............ 327/108 |
| 2008/0061341 A1* | 3/2008 | Lung ............................. 257/303 |
| 2009/0102598 A1* | 4/2009 | Yamazaki et al. .............. 338/20 |

(Continued)

FOREIGN PATENT DOCUMENTS

| JP | 2007-27537 A | 2/2007 |
| JP | 2008-235637 A | 10/2008 |

(Continued)

OTHER PUBLICATIONS

J.F. Gibbons et al., "Switching Properties of Thin NiO Films", Solid-State Electronics, 1964, pp. 785-797, Vo. 7, Pergamon Press.

(Continued)

*Primary Examiner* — Wensing Kuo
*Assistant Examiner* — Shaka White
(74) *Attorney, Agent, or Firm* — Sughrue Mion, PLLC

(57) ABSTRACT

Disclosed is a semiconductor device including a resistive change element between a first wiring and a second wiring, which are arranged in a vertical direction so as to be adjacent to each other, with an interlayer insulation film being interposed on a semiconductor substrate. The resistive change element includes a lower electrode, a resistive change element film made of a metal oxide and an upper electrode. Since the upper electrode on the resistive change element film is formed as part of a plug for the second wiring, a structure in which a side surface of the upper electrode is not in direct contact with the side surface of the metal oxide or the lower electrode is provided so that it is possible to realize excellent device characteristics, even when a byproduct is adhered to the side wall of the metal oxide or the lower electrode in the etching thereof.

17 Claims, 8 Drawing Sheets

(56) References Cited

U.S. PATENT DOCUMENTS

2009/0309088 A1* 12/2009 Sakamoto .................. 257/2
2010/0283026 A1    11/2010 Mikawa et al.

FOREIGN PATENT DOCUMENTS

| | | |
|---|---|---|
| JP | 2008-305888 A | 12/2008 |
| JP | 2009-177073 A | 8/2009 |
| JP | 2009-260052 A | 11/2009 |
| WO | WO 2007010746 A1 * | 1/2007 |
| WO | 2009/081595 A1 | 7/2009 |

OTHER PUBLICATIONS

International Search Report for PCT/JP2011/051054, dated Apr. 26, 2011.

* cited by examiner

SEMICONDUCTOR DEVICE AND METHOD OF MANUFACTURING THE SAME

CROSS REFERENCE TO RELATED APPLICATIONS

This application is a National Stage of International Application No. PCT/JP2011/051054 filed Jan. 21, 2011, claiming priority based on Japanese Patent Application No. 2010-010715 filed Jan. 21, 2010, the contents of all of which are incorporated herein by reference in their entirety.

TECHNICAL FIELD

The present invention relates to a semiconductor device and a method of manufacturing the same, and more particularly, to a structure of a nonvolatile resistive change element and a method of manufacturing the same.

BACKGROUND ART

Nonvolatile memory, which is regarded as a mainstream type of memory in the market, is realized using a technology of changing the threshold voltage of a semiconductor transistor due to electric charges stored inside an insulator film, which is disposed above a channel, as being represented by flash memory or silicon oxide nitride oxide silicon (SONOS) memory. Although miniaturization is unavoidable for the realization of high capacity, it is difficult to miniaturize a single piece of a semiconductor transistor that does not have a charge storage function. Therefore, underway are studies of allowing the transistor to perform only the function of a switch to select a memory cell that reads and writes and separating a memory device like dynamic random access memory (DRAM), such that miniaturization can be carried out for respective devices for the purpose of high capacity.

When continuously miniaturizing data storage mechanism, it is considered to use a resistive change element as a memory device. The resistive change element uses an electronic device that can convert an electrical resistance into binary or more due to any electrical stimulus. In the method of storing charges in a capacitor such as DRAM, it is unavoidable that a signal voltage decreases since the amount of charges that is stored is decreased due to miniaturization. Meanwhile, it is regarded that an electrical resistance generally has a definite value in many cases even though miniaturization is carried out, and that it is advantageous to continue miniaturization if there are a principle and a material by which the value of resistance is changed. The resistive change element operates as a switch that converts between an "on" state, i.e. a low-resistance state, and an "off" state, i.e. a high-resistance state. For example, it is possible in principle to apply the resistive change element to a switch 33 that enables a first wiring 31 and a second wiring 32 to be connected to each other, as shown in FIG. 3, and to a converter for a wiring configuration in a large scale integration (LSI).

A plurality of existing technologies is known as technologies for changing an electrical resistance due to an electrical stimulus. Among them, the technology that is best studied relates to a memory device that changes the crystalline state thereof (crystal phase-amorphous phase) in response to pulse current supplied to chalcogenide semiconductor and uses that there are two or three digits of difference in an electrical resistance of each phase. This is generally referred to as phase change memory. In a structure of metal/metal oxide/metal (hereinafter, referred to as an MIM type), in which a metal oxide is positioned between metals, it is also known that a change in resistance is caused by applying a strong voltage or current. The present invention relates to this MIM type device.

FIG. 4 is a schematic cross-sectional view of an MIM type resistive change element. This is a structure in which a resistive change element film 42 made of a metal oxide is interposed between an upper electrode 41 and a lower electrode 43. For example, according to Non-patent Document 1, a resistive change element in which a nickel oxide (NiO) is used for a resistive change element film 42 was reported. From 1950s to 1960s, studies on a variety of materials that exhibits a phenomenon in which a resistance value is changed by a voltage or current were already reported.

FIG. 5 shows current-voltage characteristics of such an MIM type resistive change element. This device remains in the high-resistance off state or the low-resistance on state in a nonvolatile way when power is turned off and the resistance state can be converted by applying a predetermined voltage/current as required. An example of the current-voltage characteristics of the on and off states is shown in FIG. 5. When a voltage of Vt1 or higher is applied to a device that is in the high-resistance off state, the device is converted into the low-resistance on state, and shows the electrical characteristic of FIG. 5(b). In turn, when a voltage Vt2 or higher is applied to the device that is in the on state of FIG. 5(b), the device is converted to the high-resistance off state and returns to the electrical state of FIG. 5(a). The operation of repeatedly converting between FIG. 5(a) and FIG. 5(b) is possible, and this characteristic can be used for a non-volatile switch or a non-volatile memory cell that serves to convert a circuit.

In an MIM type resistive change element that contains a metal oxide, a current path that is in charge of a low-resistance state is not formed in the entire electrode surface, as shown in FIG. 6. It is characterized in that the current path is defined by a localized current path 44 that has a diameter of about several nanometers, and at most, tens of nanometers. FIG. 7 shows the electrode area dependency of a resistance value in the low-resistance state of a parallel flat MIM type resistive change element, which uses NiO as a material for changing a current path resistance like Non-patent Document 1 above and is positioned between electrodes. FIG. 7 clearly demonstrates that the resistance value in the low-resistance state rarely depends on the electrode area, and that the low-resistance state is managed by the current path that is localized.

In order to enable such a current path, it is necessary to suppress an additional current path the resistance of which is not variable from occurring. Such an additional current path is mainly a byproduct 51, which is attached to a side wall at the time of etching, or a damage 52, which is formed on the side wall in the processing of a device, as shown in FIG. 8. In particular, when a resistive change material that contains a magnetic material such as Ni is used, the vapor pressure of the reaction byproduct is low and thus the probability that reaction byproduct is to be attached increases. When the upper and lower electrodes are short-circuited by the byproduct 51, if the electrical resistance of the byproduct is small, the function as a resistive change element is of course disabled by an excess current path indicated by $i_1$. Even when the resistance is higher than the on state, the resistance of the off state is lowered. In addition, when the damage 52 is introduced, the characteristics of the resistive change element are deteriorated by an excess current path indicated by $i_2$. When the device is used as a switching device, it is required for the high-resistance state of the device to realize a stable high-resistance state that is 1000 times or more than that of a memory device. It is extremely important to suppress an excess current path from occurring.

PRIOR ART DOCUMENTS

Non-patent Document

Non-patent Document 1: Solid State Electronics, Vol. 7, P. 785-797, 1964

SUMMARY OF INVENTION

Problems to be Solved by the Invention

The present invention has been made keeping in mind that foregoing circumstances, and a main object of the invention is to provide a device structure available for the realization of a switching device and a method of manufacturing the same, in which a high operating ratio is provided and the variation in characteristics between devices is reduced, and more particularly, to provide a device structure in a nonvolatile resistive change element and a process of manufacturing the same, in which the variation in characteristics between devices is reduced.

In a nonvolatile resistive change element of the related art, which includes a metal oxide layer, a short circuit sometimes occurs between upper and lower electrodes due to a metallic reaction product that is produced when an MIM type device is processed via dry etching or the like, and thus a device that does not function as a resistive change element is produced.

Therefore, the main object of the invention is to provide a structure of a semiconductor device, on which a device structure that does not deteriorate the function of a resistive change element even if a reaction product of a metal oxide included in a resistive change material is attached to the side wall of an MIM type device is mounted, and a method of manufacturing the same.

Means for Dissolving the Problem

In order to realizing the foregoing object, in an aspect of the invention, there is provided a semiconductor device that includes a resistive change element between a first wiring and a second wiring, which are arranged in a vertical direction, with an interlayer insulation film being interposed on a semiconductor substrate. The resistive change element includes an upper electrode electrically connected to the second wiring, a lower electrode electrically connected to the first wiring, and a resistive change element film interposed between the upper and lower electrodes, the resistive change element film being made of a metal oxide. The second wiring includes a plug. The plug includes a metal layer that constitutes the second wiring that is buried inside the upper electrode of the resistive change element, which is buried while covering an outermost side surface and a bottom surface of the plug. The upper electrode covering the bottom of the plug is in contact with an upper surface of the resistive change element film that is spaced apart from a side surface of the resistive change element film.

In the semiconductor device of the invention, it is preferred that the upper electrode of the resistive change element extends from the outermost side surface of the plug to an outermost side surface of the second wiring, and that the metal layer that constitutes the second wiring include a barrier metal and a copper film.

In the semiconductor device of the invention, it is preferred that the semiconductor device further includes an insulation film on the resistive change element film, the insulation film being different from the interlayer insulation film between the first and second wirings. The plug extends through the insulation film and is in contact with an upper surface of the resistive change element film.

In the semiconductor device of the invention, it is preferred that the metal used in the upper and lower electrodes includes at least one metal within Ru, Pt, Ni, Ti, Ta, W, Mo and Zr.

In the semiconductor device of the invention, it is preferred that the metal oxide that constitutes the resistive change element film includes an oxide of at least one metal within Ni, Ti, Ta, W, Zr and Hf.

In another aspect of the invention, there is provided a method of manufacturing a semiconductor device that includes: forming a first wiring on a semiconductor substrate; forming a stack film on the first wiring, the stack film including at least a lower electrode film of a resistive change element and a metal oxide being to form a resistive change element film; patterning the stack film into a predetermined shape; forming an interlayer insulation film on a whole surface; forming a wiring trench in the interlayer insulation film, the wiring trench being to form a second wiring, and a pilot hole for a plug in a bottom of the wiring trench, the pilot hole exposing an upper surface of the resistive change element film that is spaced apart from a side surface of the resistive change element film; forming a metal film that is to form an upper electrode of the resistive change element to a film thickness with which the pilot hole for a plug is not filled; forming a metal layer that is to form a second wiring on the metal film that is to form the upper electrode of the resistive change element; and planarizing the metal film that is to form the upper electrode of the resistive change element and the metal layer that is to form the second wiring until a surface of the interlayer insulation film is exposed.

Effects of the Invention

According to the invention, since the upper electrode on the resistive change element film made of a metal oxide film is buried simultaneously with the formation of the plug, it becomes possible to form the structure in which the side region of the upper electrode is not in direct contact with the side surface of the resistive change element film (metal oxide) and the lower electrode. Therefore, it is possible to prevent the device from being short-circuited between the upper and lower electrodes even when a byproduct is attached to the sidewall portion in the processing of the resistive change element film (metal oxide) and the lower electrode, thereby realizing the device structure that reduces the variation in characteristics between devices.

In addition, since the device region of the upper electrode can be defined to the inside of the device region of the resistive change element film (metal oxide), when an etching damage is formed on the sidewall portion in the processing of the resistive change element film (metal oxide), it is possible to avoid an influence from the etching damage because the etching damage is distanced from the upper electrode. Therefore, it is possible to expect that the variation in the characteristics of miniature devices is reduced.

Furthermore, since the upper electrode is formed simultaneously with the wiring plug, it is possible to set the height of the resistive change element region to be as thin as the film thickness of the upper electrode. Therefore, it is effective for miniaturization and high integration.

MODE FOR CARRYING OUT THE INVENTION

Figure 1:
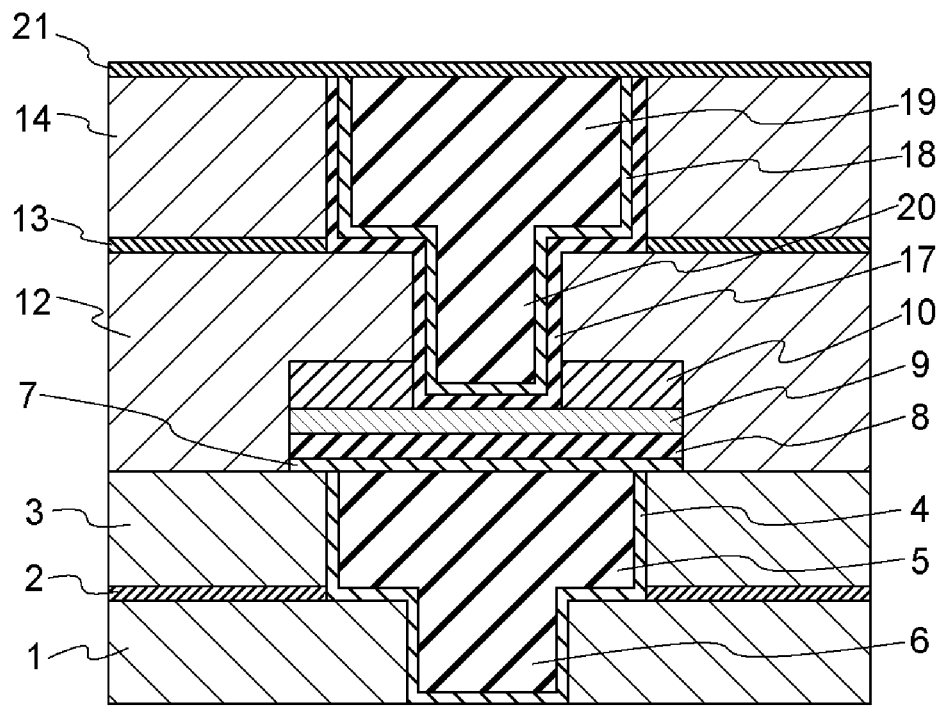
FIG. 1 is a partial cross-sectional view schematically showing a structure of a semiconductor device according to one embodiment of the invention.

A semiconductor device according to a first embodiment of the invention will be described with reference to the figures. FIG. 1 is a schematic cross-sectional view of a semiconductor device according to the invention. The semiconductor device has a structure in which a lower electrode 8, a resistive change element film 9 and a hard mask 10 are formed through a barrier layer 7 on a first wiring of the base over a semiconductor substrate (not shown). A plug 20 of a second wiring is provided on the hard mask 10, and is electrically connected to the resistive change element film 9 made of a metal oxide. The side wall and the bottom of the plug 20 are covered with an upper electrode 17 and barrier metal 18. The uppermost portion of the resistive change element film 9 that is made of a metal oxide has a structure that contacts the upper electrode formed inside the plug of the second wiring. Consequently, a structure in which neither the side surface of the resistive change element film 9 made of a metal oxide nor the side surface of the lower electrode 8 is in direct contact with the side surface of the upper electrode is realized. Although the structure in which a plug 6 of the first wiring and the plug 20 of the second wiring overlap with each other is illustrated in FIG. 1, this illustration is only for the sake of explanation. The plugs of the first and second wiring do not necessarily overlap each other. In addition, although the first wiring and the second wiring are arranged in the same direction, this is not intended to be limiting. The first and second wirings may intersect each other.

Exemplary Embodiment

FIG. 2A to FIG. 2H are schematic cross-sectional views showing a process of manufacturing the semiconductor device according to the first embodiment of the invention according to the sequence of the process.

Figure 2A:
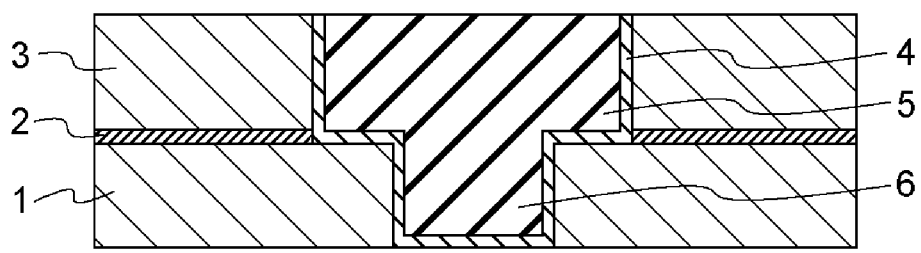
FIG. 2A is a process cross-sectional view schematically showing a structure of the semiconductor device according one embodiment of the invention.

First, as shown in FIG. 2A, an interlayer insulation film 1 (e.g. a silicon oxide film having a film thickness of 300 nm) is deposited on a semiconductor substrate (a silicon substrate) that is not shown, and then an etch stop film 2 (e.g. a SiN film having a film thickness of 50 nm) and an interlayer insulation film 3 (e.g. a silicon oxide film having a film thickness of 300 nm) are sequentially deposited on the interlayer insulation film 1. Afterwards, a first wiring trench and a pilot hole for a plug are formed using lithography (that includes forming a photoresist, dry etching, and removing the photoresist). After that, a first wiring 5 (of, for example, Cu) and a plug 6 (of, for example, Cu) are simultaneously formed, with barrier metal 4 being interposed in the wiring trench and the pilot hole, using a dual damascene wiring process. The resultant state is referred to as the initial state.

Figure 2B:
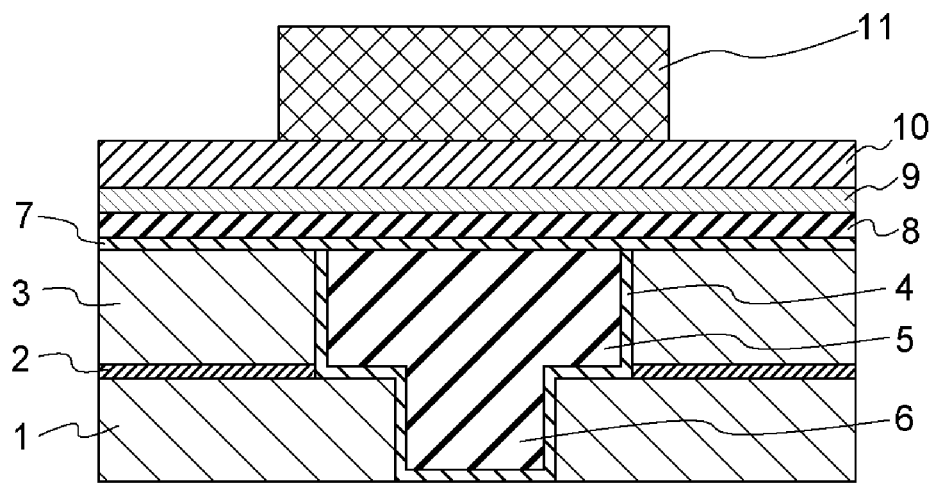
FIG. 2B is a process cross-sectional view schematically showing a structure of the semiconductor device according one embodiment of the invention.

In sequence, as shown in FIG. 2B, films of a barrier layer 7 (for example, TaN having a thickness from 5 nm to 20 nm) and a lower electrode 8 (for example, Ru having a thickness from 5 nm to 50 nm) are formed on the first wiring 5 via CVD or sputtering method. After that, a resistive change element film 9 made of a metal oxide is formed via CVD or sputtering method. The thickness of the resistive change element film 9 is set to a range from 5 nm to 100 nm, and oxides of Ni, Ti, Ta, Zr, Hf, W and Cu are considered as a resistive change material. In addition, the metal oxide is configured so as to have a single-layer structure, a stack structure, a laminated structure, or the like.

In sequence, a hard mask 10 having a thickness ranging from 30 nm to 150 nm is grown on the resistive change element film 9. A growing method thereof is generally performed via CVD or sputtering method, a silicon oxide film or a silicon nitride film is used as a material thereof, and a single-layer or stack structure is preferable.

Figure 2C:
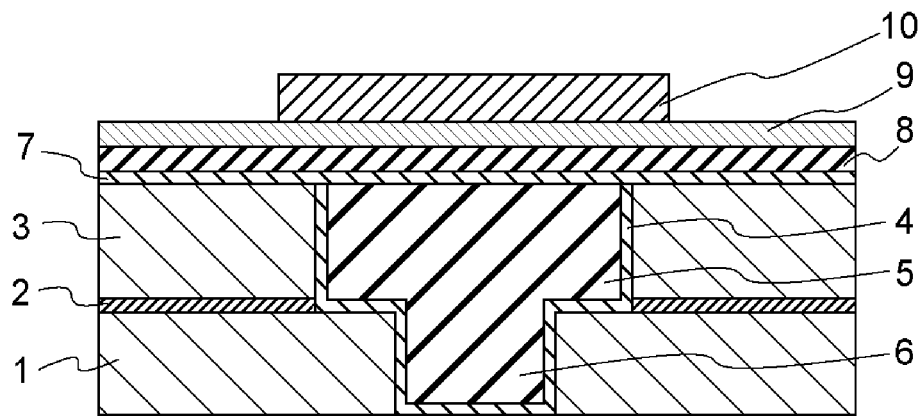
FIG. 2C is a process cross-sectional view schematically showing a structure of the semiconductor device according one embodiment of the invention.

After the hard mask 10 is grown, an unnecessary portion is removed via dry etching or the like by masking a necessary portion using a photoresist 11, thereby forming an intended hard mask shape (FIG. 2C).

Figure 2D:
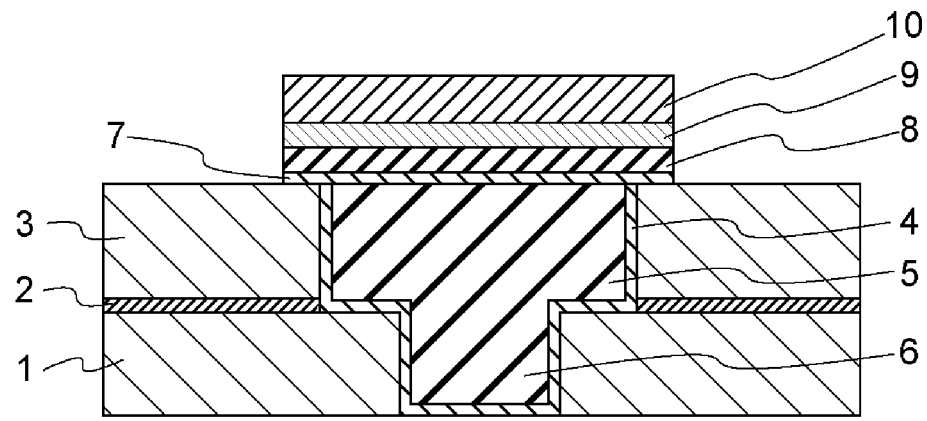
FIG. 2D is a process cross-sectional view schematically showing a structure of the semiconductor device according one embodiment of the invention.

In sequence, as shown in FIG. 2D, the resistive change element film 9, the lower electrode 8 and the barrier layer 7 are dry-etched in this sequence using the hard mask 10 as an etching mask.

The dry etching of the resistive change element film 9 is preferably carried out in etching conditions in which the side surface of the resistive change element film 9 (of, for example, NiO) is oriented perpendicular to the surface of the silicon substrate (e.g. a pressure: about 0.13 Pa to about 6.7 Pa (1 mTorr to 50 mTorr), an etching gas: a mixture gas of $BCl_3/Cl_2/Ar$ or a mixture gas of $CH_3OH/Ar$, a source power: 300 W to 1000 W, a bias power: 50 W to 900 W, Vpp: 400 to 800 V). For the resistive change element film, a stack structure of TiO and $Ta_2O_5$ layers is considered in addition to NiO single layer. Here, the material of the resistive change element film made of a metal oxide results in an etching reaction product that has a low vapor pressure. Therefore, in some cases, the etching reaction product is adhered to the side surface of the resistive change element film 9 or an etching damage occurs.

In sequence, the dry etching of the lower electrode 8 is preferably carried out in etching conditions in which the side surface of the lower electrode 8 (of, for example, Ru) is oriented perpendicular to the surface of the silicon substrate (e.g. a pressure: about 0.67 Pa to about 4 Pa (5 mTorr to 30 mTorr), an etching gas: a mixture gas of $O_2/Cl_2$ gas, a source power: 500 W to 1500 W, a bias power: 50 W to 300 W). For the material of the lower electrode, Pt, Ni, Ti, TiN, Ta, W, Mo or Zr is considered in addition to Ru. Here, the material of the lower electrode results in an etching reaction product that has a low vapor pressure. Therefore, in some cases, the etching reaction product is adhered to the side surface of the lower electrode 8 or an etching damage occurs.

Afterwards, the barrier layer 7 is etched, so that a resistive change element structure that includes the resistive change element film 9, the lower electrode 8 and the barrier layer 7 is formed under the hard mask 10.

Figure 2E:
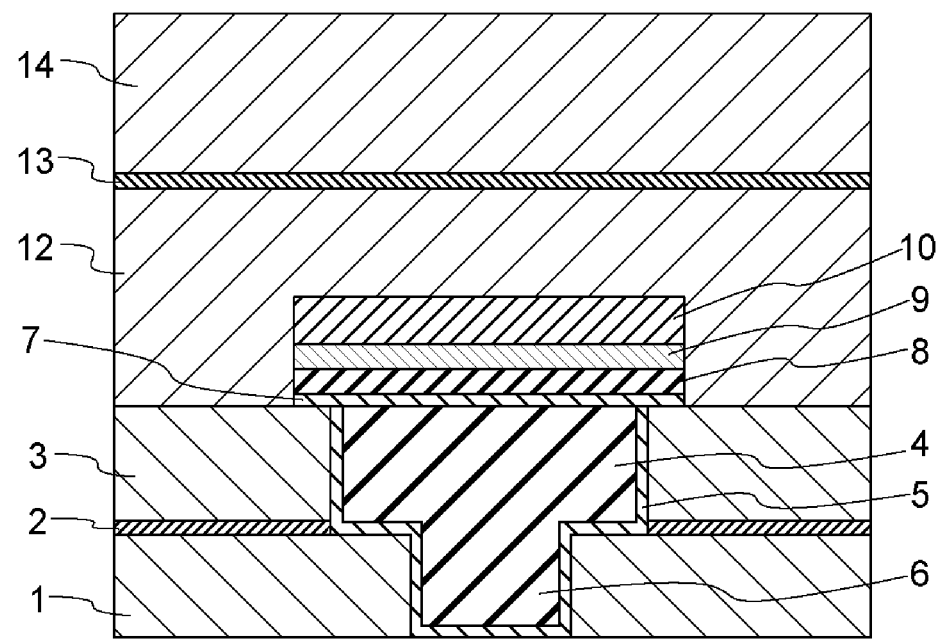
FIG. 2E is a process cross-sectional view schematically showing a structure of the semiconductor device according one embodiment of the invention.
Figure 2F:
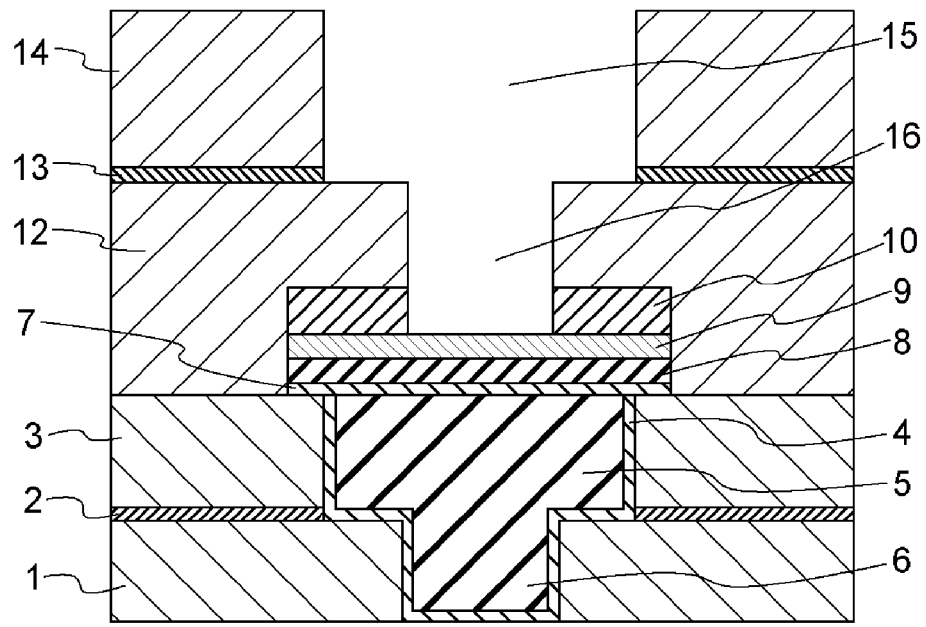
FIG. 2F is a process cross-sectional view schematically showing a structure of the semiconductor device according one embodiment of the invention.

In sequence, as shown in FIG. 2E, an interlayer insulation film 12 (e.g. a silicon oxide film having a film thickness of 300 nm to 500 nm) is deposited via plasma CVD method, and the interlayer insulation film is planarized via CMP. Afterwards, an etch stop film 13 (e.g. a SiN film having a film thickness of 50 nm) and an interlayer insulation film 14 (e.g. a silicon oxide film having a film thickness of 300 nm) are sequentially deposited on the interlayer insulation film 12. After that, as shown in FIG. 2F, a wiring trench 15 for the second wiring and a pilot hole 16 for a plug are formed.

Figure 2G:
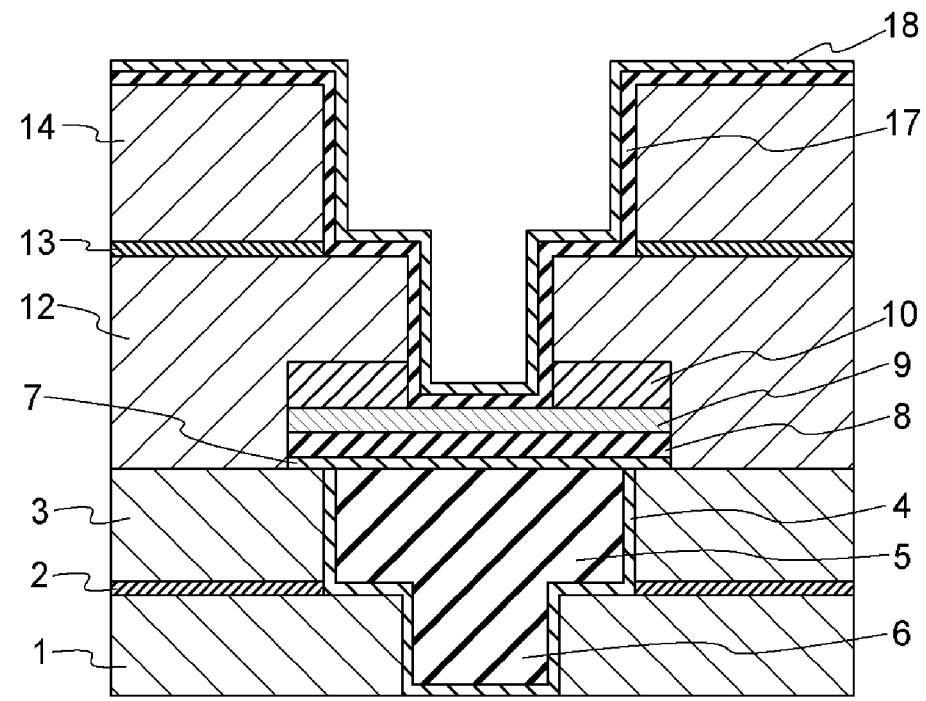
FIG. 2G is a process cross-sectional view schematically showing a structure of the semiconductor device according one embodiment of the invention.

In sequence, as shown in FIG. 2G, a film of an upper electrode 17 (of, for example, Ru having a thickness from 5 nm to 50 nm) is formed on the side walls and the bottoms of the wiring trench 15 and the pilot hole 16 for a plug via CVD or sputtering method. In addition, a film of barrier metal 18 is sequentially formed.

Figure 2H:
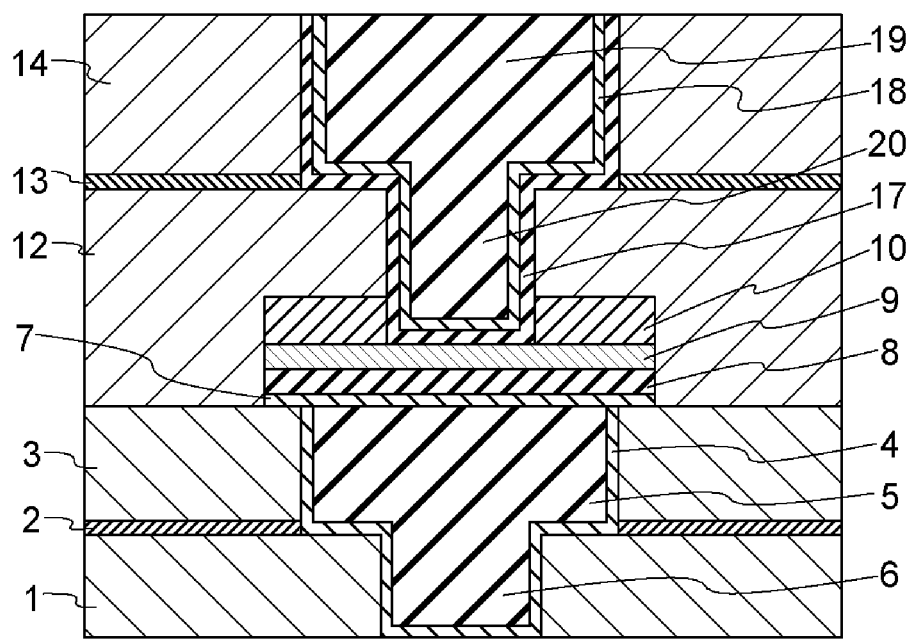
FIG. 2H is a process cross-sectional view schematically showing a structure of the semiconductor device according one embodiment of the invention.
Figure 3:
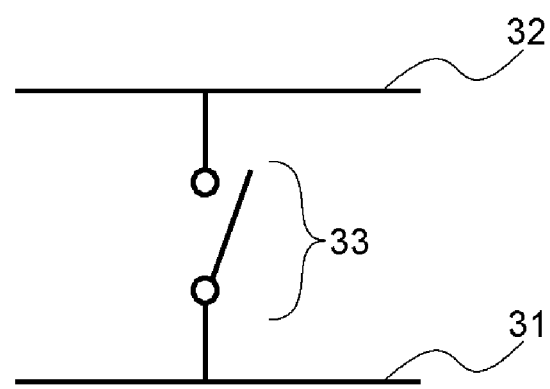
FIG. 3 is a view showing a switch by which two wirings are connected to each other.
Figure 4:
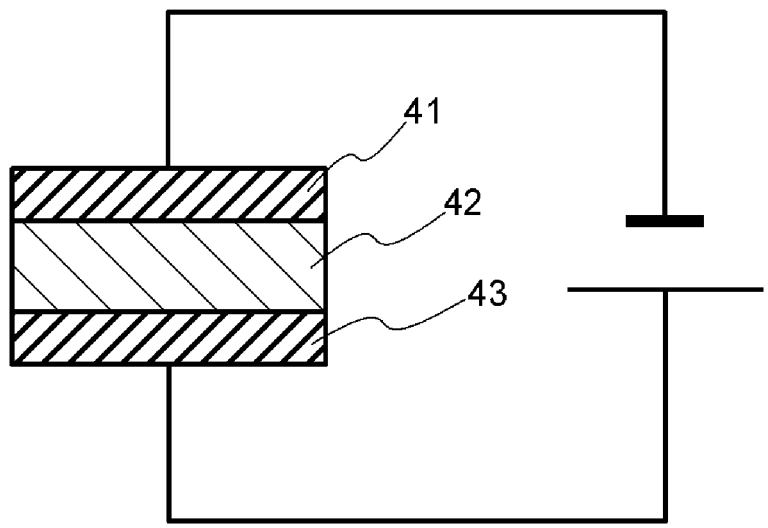
FIG. 4 is a schematic cross-sectional view of a typical MIM type resistive change element.

After that, as shown in FIG. 2H, using a dual damascene wiring process, a second wiring 19 (of, for example, Cu) and a plug 20 (of, for example, Cu) are simultaneously formed inside the wiring trench 15 and the pilot hole 16, with the upper electrode 17 and the barrier metal 18 being interposed therebetween. After that, as shown in FIG. 1, an insulating barrier film 21 (e.g. a SiN film) is deposited on the interlayer insulating film 14 that includes the second wiring 19, thereby forming multi interconnections.

According to this exemplary embodiment, the structure in which the resistive change element film 9 is not in direct contact with the side surface of the upper electrode 17 can be realized by burying the upper electrode 17, which is integrated with the barrier metal 18, in the second wiring 19. For example, when a reaction product is adhered to the side surface of the resistive change element film in the etching of the resistive change element film 9, it is possible to prevent a short circuit between the upper and lower electrodes in the device, thereby realizing an improvement in the reliability of the device. In addition, the integration of the upper electrode with at least the plug of the second wiring 19 makes it possible to miniaturize the size of the device by only decreasing the film thickness of the resistive change element film 9 and the lower electrode 8.

This application claims priority based on Japanese Patent Application No. 2010-010715, filed Jan. 21, 2010, the entire disclosure of which is incorporated herein.

INDUSTRIAL APPLICABILITY

Figure 5:
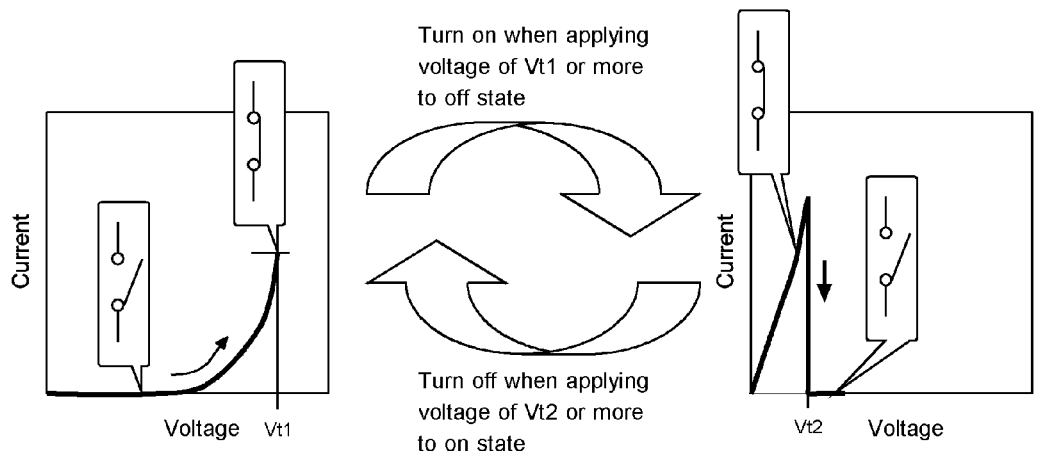
FIG. 5 shows a typical resistance change characteristic using a Ni oxide as a resistive change material in an MIM type resistive change element.
Figure 6:
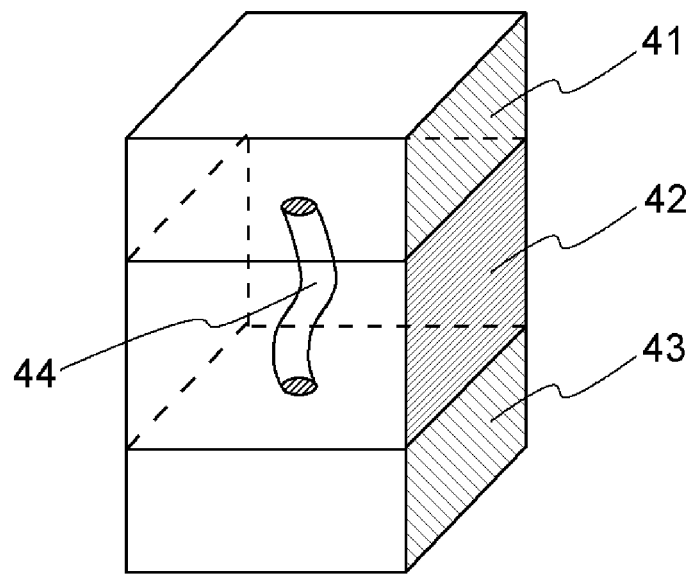
FIG. 6 is a top perspective view of an MIM type resistive change element, in which a localized current path that is in charge of an on state is schematically shown.
Figure 7:
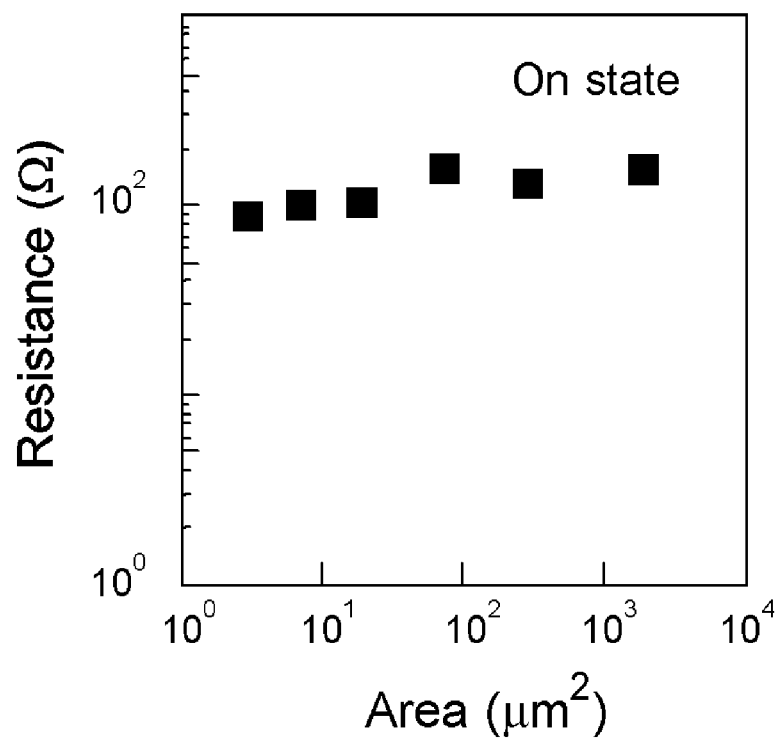
FIG. 7 shows the electrode area dependency of an on resistance in a parallel flat MIM type resistive change element.
Figure 8:
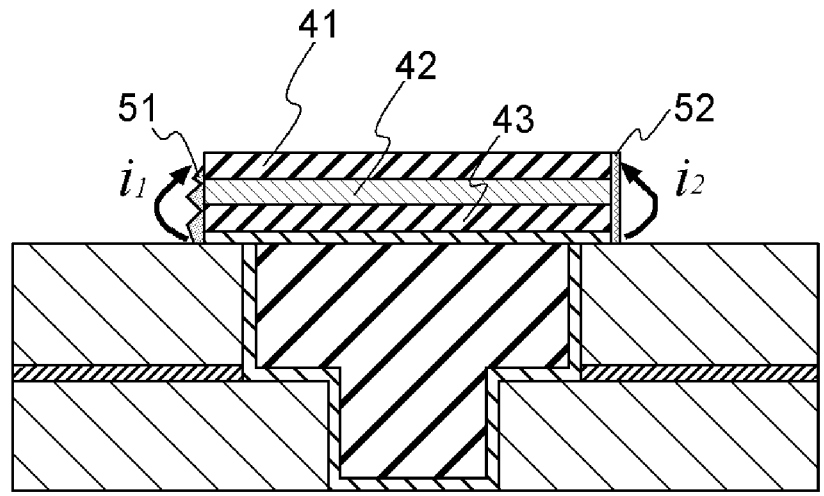
FIG. 8 is a schematic cross-sectional view of an MIM type resistive change element, in which a parasitic current path caused by the influence of dry etching is shown.
Figure 9:
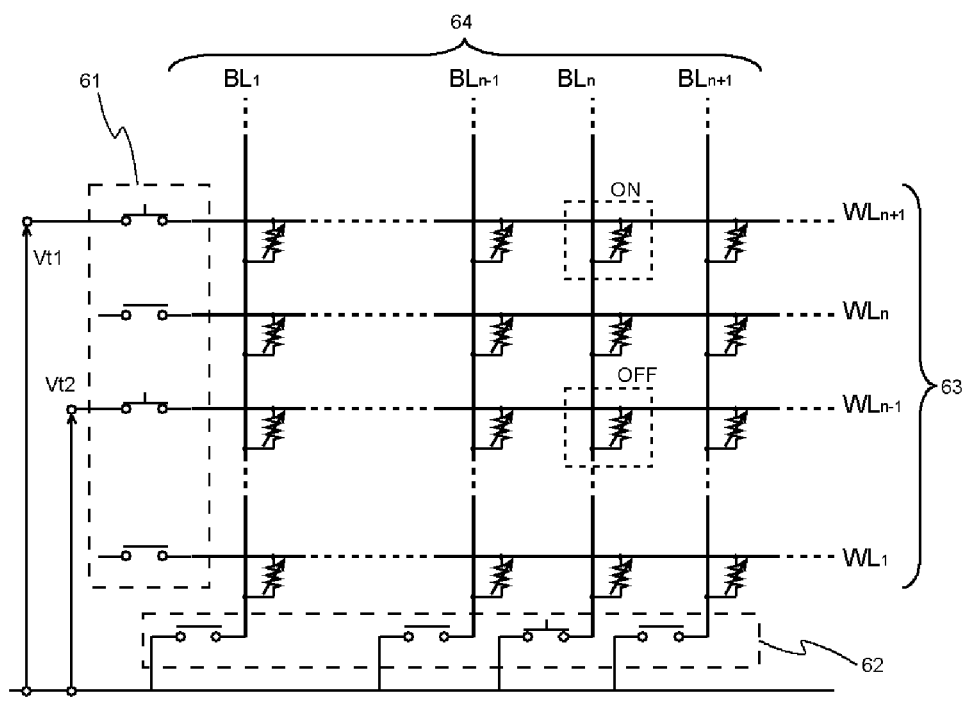
FIG. 9 is a schematic circuit diagram of a nonvolatile memory cell array using an MIM type resistive change element.

Although the foregoing description has been illustrated about the semiconductor device, in which the resistive change element is provided between the first and second wirings as one switch device, the present invention is not limited thereto. It is also possible to construct a memory cell having a matrix structure by arranging first and second wirings so as to intersect each other a plurality of times and arranging a resistive change element at each point of intersection of the first and second wirings, so that one of the first and second wirings is set as a word line and the other one of the first and second wirings is set as a bit line. For example, FIG. 9 shows a schematic view of a memory cell array using a resistive change element, in which one of a first wiring group 63 and a second wiring group 64 is set as a word line and the other is set as a bit line, and data can be read by selecting a resistive change element, which is positioned at coordinates BLn and WLn, using a row decoder 61 and a column decoder 62. In addition, as for write and delete, as described with reference to FIG. 5, the off state of the resistive change element can be converted into an on state by applying a voltage of Vt1 or higher (herein, WLn+1), and the on state of the resistive change element can be converted into an off state by applying a voltage of Vt2 or higher (herein, WLn−1). In the meantime, Vt1 and Vt2 are not applied at the same time, but applied separately. Although simple switches are illustrated inside the decoders 61 and 62, switching is performed using transistors in practice.

EXPLANATION OF REFERENCE NUMERALS 1 interlayer insulating film
2 etch stop film (SiN)
3 interlayer insulating film
4 barrier metal
5 first wiring (Cu)
6 plug (Cu)
7 barrier layer
8 lower electrode (Ru)
9 resistive change layer (NiO)
10 hard mask
11 photoresist
12 interlayer insulation film
13 etch stop film (SiN)
14 interlayer insulation film
15 wiring trench of second wiring
16 pilot hole for plug
17 upper electrode (Ru)
18 barrier metal
19 second wiring (Cu)
20 plug (Cu)
21 barrier film (SiN)
31 first wiring
32 second wiring
33 switching device
41 upper first electrode in MIM type device
42 resistive change material made of metal oxide
43 lower second electrode in MIM type device
44 current path that is in charge of on state in MIM type resistive change element

The invention claimed is:

1. A semiconductor device comprising a resistive change element between a first wiring and a second wiring, which are arranged in a vertical direction, with an interlayer insulation film being interposed on a semiconductor substrate,
wherein the resistive change element comprises:
an upper electrode electrically connected to the second wiring;
a lower electrode electrically connected to the first wiring; and a resistive change element film interposed between the upper and lower electrodes, the resistive change element film being made of a metal oxide, wherein the second wiring comprises a plug, wherein the plug comprises a metal layer that constitutes the second wiring that is buried inside the upper electrode of the resistive change element, which is buried while covering an outermost side surface and a bottom surface of the plug, wherein the metal layer that constitutes the second wiring comprises a barrier metal and a copper film, and wherein the upper electrode covering the bottom of the plug is in contact with an upper surface of the resistive change element film that is spaced apart from a side surface of the resistive change element film.

2. The semiconductor device according to claim 1, wherein the upper electrode of the resistive change element extends from the outermost side surface of the plug to an outermost side surface of the second wiring.

3. The semiconductor device according to claim 1, further comprising an insulation film on the resistive change element film, the insulation film being different from the interlayer insulation film between the first and second wirings, wherein the plug extends through the insulation film and is in contact with an upper surface of the resistive change element film.

4. The semiconductor device according to claim 1, wherein the first wiring comprises a barrier metal and a copper film as a metal film, and the barrier layer is interposed between the copper film and the lower electrode.

5. The semiconductor device according to claim 1, wherein the lower electrode comprises at least one metal selected from Ru, Pt, Ni, Ti, Ta, W, Mo and Zr.

6. The semiconductor device according to claim 1, wherein the metal oxide that constitutes the resistive change element film comprises an oxide of at least one metal selected from Ni, Ti, Ta, W, Zr and Hf.

7. A method of manufacturing a semiconductor device, comprising:

forming a first wiring on a semiconductor substrate;

forming a stack film on the first wiring, the stack film including at least a lower electrode film of a resistive change element and a metal oxide to form a resistive change element film;

patterning the stack film into a predetermined shape;

forming an interlayer insulation film on a whole surface;

forming a wiring trench in the interlayer insulation film, the wiring trench being to form a second wiring, and a pilot hole for a plug in a bottom of the wiring trench, the pilot hole exposing an upper surface of the resistive change element film that is spaced apart from a side surface of the resistive change element film;

forming a metal film that is to form an upper electrode of the resistive change element to a film thickness with which the pilot hole for a plug is not filled;

forming a metal layer that is to form a second wiring on the metal film that is to form the upper electrode of the resistive change element; and planarizing the metal film that is to form the upper electrode of the resistive change element and the metal layer that is to form the second wiring until a surface of the interlayer insulation film is exposed, wherein the metal layer that constitutes the second wiring comprises a barrier metal and a copper film.

8. The method of manufacturing a semiconductor device according to claim 7, wherein the first wiring is a copper wiring that is buried in a wiring trench formed in a lower interlayer insulation film by a damascene method, the method further comprising forming a barrier layer on the first wiring, and then forming the lower electrode film of the resistive change element, the metal oxide being to form the resistive change element film and a hard mask layer, patterning the hard mask layer into a predetermined shape, and then etching the metal oxide, the lower electrode film and the barrier layer using the hard mask layer as a mask, thereby forming a resistive change element structure.

9. A semiconductor device comprising a resistive change element between a first wiring and a second wiring, which are arranged in a vertical direction, with an interlayer insulation film being interposed on a semiconductor substrate, wherein the resistive change element comprises:

an upper electrode electrically connected to the second wiring;

a lower electrode electrically connected to the first wiring; and a resistive change element film interposed between the upper and lower electrodes, the resistive change element film being made of a metal oxide, wherein the second wiring comprises a plug having a rectangular shape as an entire vertical section, wherein the plug comprises a metal layer that constitutes the second wiring that is buried inside the upper electrode of the resistive change element, which is buried while covering an outermost side surface and a bottom surface of the plug, wherein the upper electrode covering the bottom of the plug is in contact with an upper surface of the resistive change element film that is spaced apart from a side surface of the resistive change element film, and wherein the metal layer that constitutes the second wiring comprises a barrier metal and a copper film.

10. The semiconductor device according to claim 9, wherein the upper electrode has a constant thickness at the bottom and the side surface of the plug.

11. The semiconductor device according to claim 9, wherein the first and second wirings horizontally extend to the same direction or respective directions intersecting each other.

12. The semiconductor device according to claim 11, wherein the first and second wirings horizontally extend to the respective directions intersecting each other, and wherein the plug and the resistive change element are arranged at a point of intersection of the first and second wirings.

13. The semiconductor device according to claim 9, wherein the upper electrode of the resistive change element extends from the outermost side surface of the plug to an outermost side surface of the second wiring.

14. The semiconductor device according to claim 9, further comprising an insulation film on the resistive change element film, the insulation film being different from the interlayer insulation film between the first and second wirings, wherein the plug extends through the insulation film and is in contact with an upper surface of the resistive change element film.

15. A semiconductor device comprising a resistive change element between a first wiring and a second wiring, which are arranged in a vertical direction, with an interlayer insulation film being interposed on a semiconductor substrate, wherein the resistive change element comprises:

an upper electrode electrically connected to the second wiring;

a lower electrode electrically connected to the first wiring; and a resistive change element film interposed between the upper and lower electrodes, the resistive change element film being made of a metal oxide,
- wherein the second wiring comprises a plug having a rectangular shape as an entire vertical section,
- wherein the plug comprises a metal layer that constitutes the second wiring that is buried inside the upper electrode of the resistive change element, which is buried while covering an outermost side surface and a bottom surface of the plug,
- wherein the upper electrode covering the bottom of the plug is in contact with an upper surface of the resistive change element film that is spaced apart from a side surface of the resistive change element film,
- wherein the first wiring comprises a barrier metal and a copper film as a metal film, and the barrier layer is interposed between the copper film and the lower electrode.

16. The semiconductor device according to claim 9, wherein the lower electrode comprises at least one metal selected from Ru, Pt, Ni, Ti, Ta, W, Mo and Zr.

17. The semiconductor device according to claim 9, wherein the metal oxide that constitutes the resistive change element film comprises an oxide of at least one metal selected from Ni, Ti, Ta, W, Zr and Hf.

* * * * *